(12) United States Patent
Ruby et al.

(10) Patent No.: US 6,429,511 B2
(45) Date of Patent: Aug. 6, 2002

(54) MICROCAP WAFER-LEVEL PACKAGE

(75) Inventors: Richard C. Ruby, Menlo Park; Tracy E. Bell, Campbell; Frank S. Geefay, Cupertino; Yogesh M. Desai, San Jose, all of CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/969,432

(22) Filed: Oct. 1, 2001

Related U.S. Application Data

(62) Division of application No. 09/415,284, filed on Oct. 8, 1999, which is a continuation of application No. 09/359,844, filed on Jul. 23, 1999, now Pat. No. 6,265,246.

(51) Int. Cl.[7] .............................................. H01L 23/48
(52) U.S. Cl. ........................ 257/704; 257/685; 257/686; 257/723; 257/777
(58) Field of Search ................................ 257/704, 685, 257/686, 723, 724, 725, 730, 777; 439/106, 109; 174/52.1, 52.2, 52.3, 52.4

(56) References Cited

U.S. PATENT DOCUMENTS

| | | | | |
|---|---|---|---|---|
| 3,784,883 A | * | 1/1974 | Duncan et al. | 317/234 |
| 5,373,627 A | * | 12/1994 | Grebe | 174/52.2 |
| 5,448,014 A | * | 9/1995 | Kong et al. | 174/52.3 |
| 5,543,663 A | * | 8/1996 | Takubo | 257/720 |
| 5,593,919 A | * | 1/1997 | Lee et al. | 437/190 |
| 5,604,160 A | | 2/1997 | Warfield | |
| 5,731,542 A | * | 3/1998 | Limper-Brenner et al. | 174/52.4 |
| 5,786,239 A | | 7/1998 | Ohsana et al. | |
| 5,825,085 A | * | 10/1998 | Masumoto et al. | 257/704 |
| 5,888,884 A | | 3/1999 | Wujnarowski | |
| 6,043,109 A | | 3/2000 | Yang et al. | |
| 6,228,675 B1 | * | 5/2001 | Ruby et al. | 438/106 |

FOREIGN PATENT DOCUMENTS

| | | |
|---|---|---|
| EP | 0828346 A2 | 3/1998 |
| EP | 1070677 A2 | 1/2001 |
| EP | 1071126 A2 | 1/2001 |
| FR | 257982 | 10/1986 |

\* cited by examiner

*Primary Examiner*—David L. Talbott
*Assistant Examiner*—Lourdes Cruz

(57) ABSTRACT

A microcap wafer-level package is provided in which a micro device is connected to bonding pads on a base wafer. A peripheral pad on the base wafer encompasses the bonding pads and the micro device. A cap wafer has gaskets formed thereon using a thick photoresist semiconductor photolithographic process. Bonding pad gaskets match the perimeters of the bonding pads and a peripheral pad gasket matches the peripheral pad on the base wafer. Wells are located inside the perimeters of the bond pad gaskets and are formed to a predetermined depth in the cap wafer. The cap wafer is then placed over the base wafer to cold weld bond the gaskets to the pads and form a hermetically sealed volume between the bonding pad gaskets and the peripheral pad gasket. The cap wafer is then thinned below the predetermined depth until the wells become through holes that provide access to the bonding pads inside the package, but outside the hermetically sealed volume, for connecting wires from a micro device utilizing system.

10 Claims, 6 Drawing Sheets

MICROCAP WAFER-LEVEL PACKAGE

CROSS-REFERENCE TO RELATED APPLICATIONS

This is a divisional of application Ser. No. 09/415,284 filed on Oct. 8, 1999.

This is a Continuation of U.S. patent application by Richard C. Ruby, Tracy E. Bell, Frank S. Geefay, and Yogesh M. Desai titled "MICROCAP WAFER-LEVEL PACKAGE", identified by Ser. No. 09/359,844 and filed on Jul. 23, 1999 now U.S. Pat. No. 6,265,246.

TECHNICAL FIELD

The present invention relates to wafer-level packaging techniques, and more specifically to wafer-level, chip-scale packaging of semiconductors.

BACKGROUND ART

Currently, there are a number of wafer-to-wafer bonding techniques that have been used for packaging semiconductor devices. Techniques used have included silicon-to-glass anodic bonding, silicon-to-silicon fusion bonding, and wafer-to-wafer bonding using intermediate materials as the actual bonding media. Such intermediate materials have included silicon dioxide, and soft metals such as gold, indium, and aluminum, and have been bonded using electrical, thermal and/or compression techniques.

There are various problems with all of these techniques. The anodic bonding of a glass wafer to a silicon wafer involves the use of high voltages that can be detrimental to the electronic circuits present on the silicon wafer. Similarly, the silicon-to-silicon bonding has to be done at very high voltage and also at a high temperature. Both of these techniques can melt metals with lower melting points than the temperature required to perform the bonding so they cannot be used with certain types of semiconductor devices on silicon wafers. Materials such as glass frit involve relatively large bonding areas which results in an increased die size thereby limiting the number of devices that can be fabricated on a given wafer. Further, some of these techniques cannot assure reliable hermetic seals of the packaged device.

One example of such packaging method is shown in U.S. Pat. No. 5,448,014 to Kong et al. However, Kong et al. requires multi-layer standoffs to adjust the distance between the two wafers. Additionally, the disclosed use of different materials for each of the wafers can cause potentially adverse consequences due to the different thermal coefficients of expansion of the materials when the package is manufactured using heat as disclosed.

A relatively simple process that would provide a non-electrical, low temperature method for hermetically packaging micro devices on or in semiconductor wafers has long been sought. Further, a process has been sought which uses processes that are standard, or close to standard, and presently used in a typical semiconductor laboratory or manufacturing facility.

Also, in the past, making electrical contact to the packaged devices was difficult because existing methods did not provide a wafer-to-wafer seal that allows the electrical conductor to pass through the wafer package itself without the use of epoxy, grommets, or sealing rings in the through holes around the wires. The previous sealing techniques, besides being very small and difficult to implement, were subject to leaking because of the flexing of the wire in the seal, which would open the seal.

DISCLOSURE OF THE INVENTION

The present invention provides a microcap wafer-level package in which a micro device is connected to bonding pads on a base wafer. A peripheral pad on the base wafer encompasses the bonding pads and the micro device. A cap wafer has gaskets formed thereon. Bonding pad gaskets match the perimeters of the bonding pads, and a peripheral pad gasket matches the peripheral pad on the base wafer. Wells are located inside the perimeters of the bond pad gaskets and are formed to a predetermined depth in the cap wafer. The cap wafer is then placed over the base wafer so as to bond the gaskets to the pads and form a hermetically sealed volume between the bonding pad gaskets and the peripheral pad gasket. The cap wafer is thinned to form a "microcap". Essentially, the microcap is thinned below the predetermined depth until the wells become through holes that provide access to the bonding pads inside the package, but outside the hermetically sealed volume, for conductors from a micro device utilizing system. This arrangement assures a highly reliable hermetic seal for the wafer-level package, which allows electrical connections without passing through a seal. Further, this process permits the wafers to be made thinner than previously practical because it forms the microcap in situ and avoids the handling of the fragile microcap during assembly.

The present invention further provides a microcap wafer-level package in which a micro device is connected to bonding pads on a base wafer. A peripheral pad on the base wafer encompasses the bonding pads and the micro device. A cap wafer is processed to form wells of a predetermined depth in the cap wafer. A conductive material is coated onto the walls of the wells in the cap wafer. The cap wafer has contact gaskets and a peripheral gasket formed thereon where the contact gaskets are capable of being aligned with the bonding pads on the base wafer, and the gasket matches the peripheral pad on the base wafer. The cap wafer is then placed over the base wafer so as to bond the contact gaskets and gasket to the pads and form a hermetically sealed volume within the peripheral gasket. The cap wafer is thinned below the predetermined depth until the conductive material is exposed to form conductive vias through the cap wafer to outside the hermetically sealed volume. This via arrangement assures a reliable, high conductivity, hermetically sealed connection into the wafer-level package. Further, this process permits the wafers to be made thinner than previously practical because it forms the microcap in situ and avoids the handling of the fragile microcap during assembly.

The present invention provides an electrical or mechanical device in a wafer-level, chip-scale package that hermetically seals the semiconductor device while providing electrical or thermal connection through one of the wafers.

The present invention further provides a device in a wafer-level, chip-scale package that allows an electrical connection to the device to be made through the wafer sealing the package itself.

The present invention further provides a device in a wafer-level, chip-scale package that allows an electrical connection to the device to be made through openings in a cap wafer to bonding pads, which are individually sealed at the same time the device, is sealed.

The present invention further provides a wafer-level, chip-scale packaging technique utilizing a low-temperature, batch process done at the wafer level which results in a hermetic seal and allows electrical contacts to be made to standard bonding pads on a base wafer.

The present invention further provides a relatively simple process that results in a hermetic seal for semiconductor devices which does not require high voltages or temperatures.

The present invention further provides a method of manufacturing a wafer package utilizing process steps and equipment that are standard or close to standard to the processes and equipment used in a typical semiconductor laboratory or manufacturing facility.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
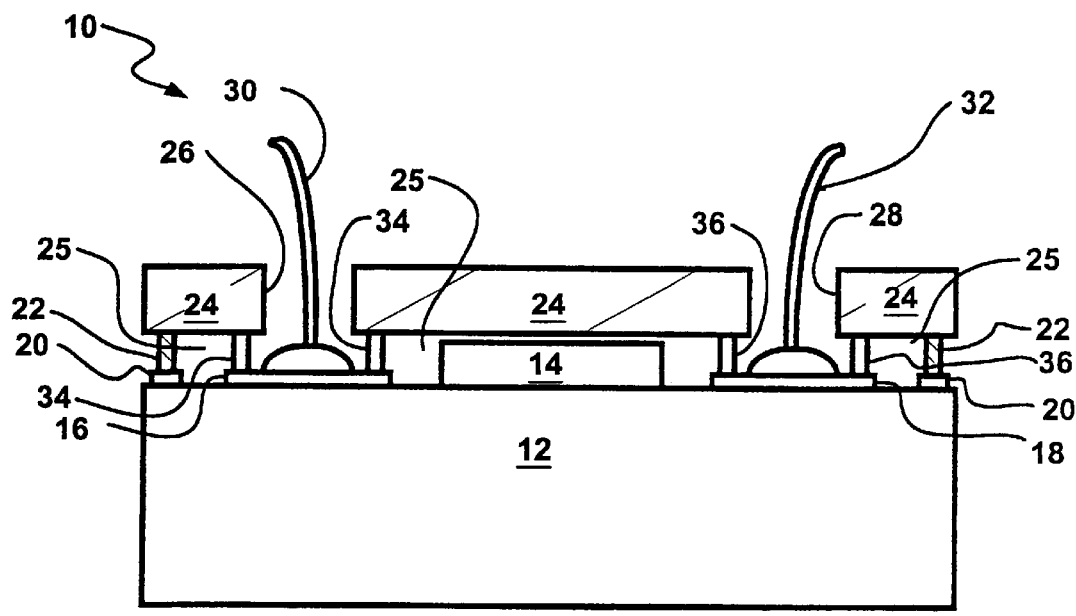
FIG. 1 shows a cross-section of the microcap wafer-level package of the present invention.

Referring now to FIG. 1, therein is shown a cross section of a microcap wafer-level package 10. The microcap wafer-level package 10 has a base wafer 12 with an associated micro device 14, such as an active device like an integrated circuit or a passive device like a sensor. Bonding pads 16 and 18, electrically connected to the micro device 14 by conductive leads (not shown), are also associated with the base wafer 12. Around the perimeter of the base wafer 12 is a peripheral pad 20 which may be deposited at the same time as the bonding pads 16 and 18.

A peripheral pad seal, or gasket 22, extends between a cap wafer 24 and the peripheral pad 20 on the base wafer 12 and is cold weld bonded to the peripheral pad 20 to provide a hermetically sealed volume 25 around the micro device 14. The cap wafer 24 can be made of an electronically non-conductive material or a high-resistivity semiconductor material, such as single crystal silicon. Preferably, however, both the base wafer 12 and the cap wafer 24 are made of the same semiconductor material to avoid thermal expansion mismatch problems.

The cap wafer 24 has through holes 26 and 28 provided therein allowing access to the bonding pads 16 and 18, respectively. The through holes 26 and 28 are from 10 to 500 microns in diameter to allow access for conventional wire bonding tools. Conductors, such as bonding wires 30 and 32, can be respectively wire bonded to the bonding pads 16 and 18 to make the electrical connections to the micro device 14. Bonding pad seals, or gaskets 34 and 36, bond to the respective perimeters of the bonding pads 16 and 18, and the gasket 22 bonds to the peripheral pad 20 to form a hermetically sealed volume 25. The hermetically sealed volume 25 encompasses the micro device 14 and the bonding pad gaskets 34 and 36.

Also, electrical connections (not shown) between the micro device 14 and the bonding pads 16 and 18 are within the hermetically sealed volume 25 and do not pass through any gaskets.

The bonding pads 16 and 18, the gaskets 22, 34, and 36, and the peripheral pad 20 in the embodiment shown are of gold; however, other materials can be used without departing from the scope of the present invention. For example, other materials capable of being bonded to each other can be used, such as silicon, indium, aluminum, copper, silver, alloys thereof, and compounds thereof.

Referring now to FIGS. 2A through 2F, therein are shown process steps for manufacturing the microcap wafer-level package 10 shown in FIG. 1. Hereinafter, all components, which are the same in the various figures, will use the same description and number notations.

Figure 2A:
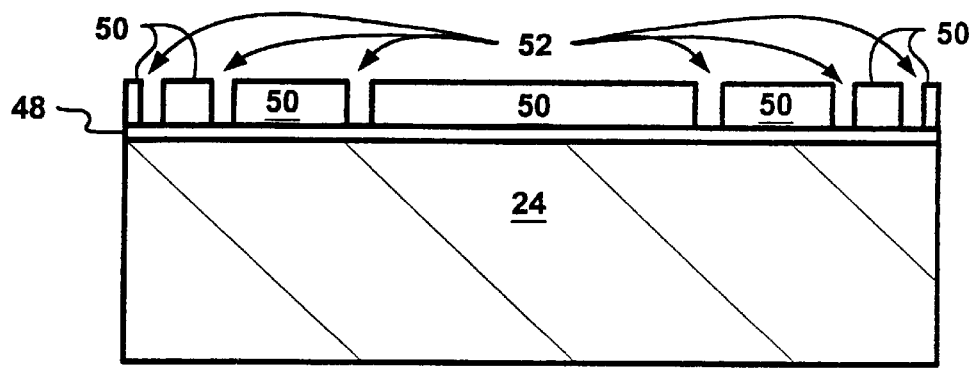
FIGS. 2A through 2F show the process steps for fabricating the microcap wafer-level package of the present invention.

FIG. 2A shows the cap wafer 24. A conductive seed layer 48 is deposited through a process such as sputtering or evaporation over the entire well-side surface of cap wafer 24. In the preferred embodiment, the seed layer 48 is of gold. The gold is deposited in a sequence in which an initial deposition of a very thin adhesion layer (not shown) is sputtered.

The adhesion layer is of a material to which the seed layer 48 adheres well and that adheres well to the cap wafer 24. In the best mode, the adhesion layer is of a metal such as chromium, nickel-chromium, titanium, or an alloy thereof where the seed layer 48 is gold and the cap wafer 24 is silicon. Then gold is deposited on top of the adhesion layer by sputtering. An exemplary thickness of gold would be 2,000 to 3,000 angstroms (Å). The adhesion layer is used because gold itself does not adhere well directly to silicon. Both layers, however, typically are laid down in a single sputtering or evaporation run using conventional manufacturing equipment.

A photoresist layer 50 is deposited, exposed and developed in a conventional photolithographic process to produce the pattern openings 52, which define the shapes of the gaskets 22, 34, and 36. It is preferred that thick photoresist lithography be used to create the pattern for the formation of the gaskets 22, 34, and 36. Standard photoresist forms relatively thin layers so a higher viscosity, thick photoresist layer 50 is required. If necessary, multiple layers of the thick photoresist layer 50 are used. The photoresist used to pattern the gaskets 22, 34, and 36 needs to be at least as thick as the final thickness of the gaskets 22, 34, and 36.

Figure 2B:
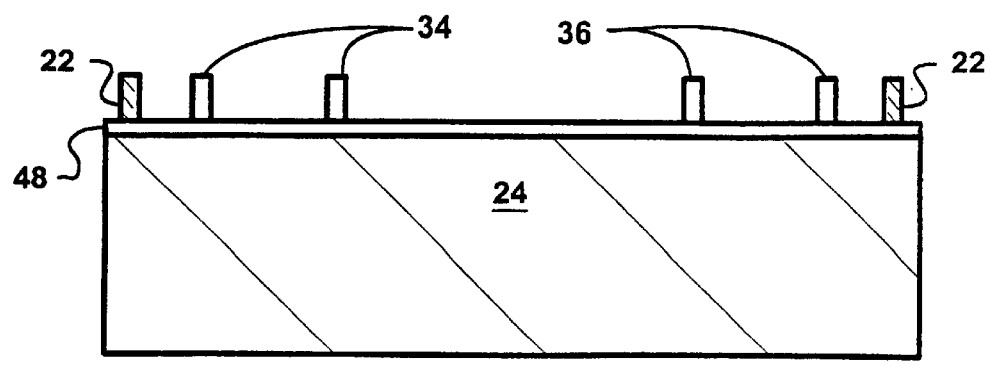

FIG. 2B shows the cap wafer 24 after it has been electroplated using the seed layer 48 as an electrode. The conductive material of the gaskets is deposited in the openings 52 in the photoresist layer 50 on the electrically conductive seed layer 48. The photoresist layer 50 is then removed using a conventional photoresist stripping technique.

Figure 2C:
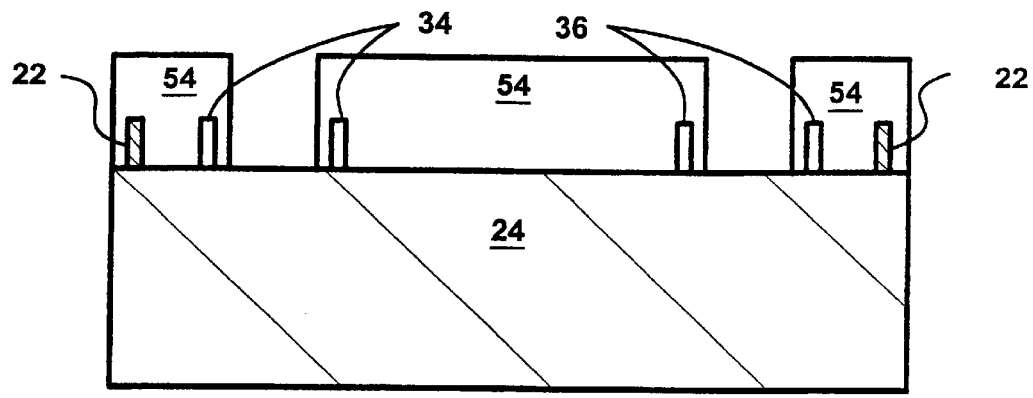

In FIG. 2C, the remaining seed layer 48, which was formerly under the photoresist layer 50, is etched away by a conventional etching process. The gaskets 22, 34, and 36 are reduced in height and thinned by the thickness of the seed layer 48 that is removed. Another thick photoresist layer 54 is deposited to cover the gaskets 22, 34, and 36.

Using thick photoresist photolithography, the photoresist layer 54 is patterned and developed to expose the areas of the cap wafer 24 where wells are to be etched.

Figure 2D:
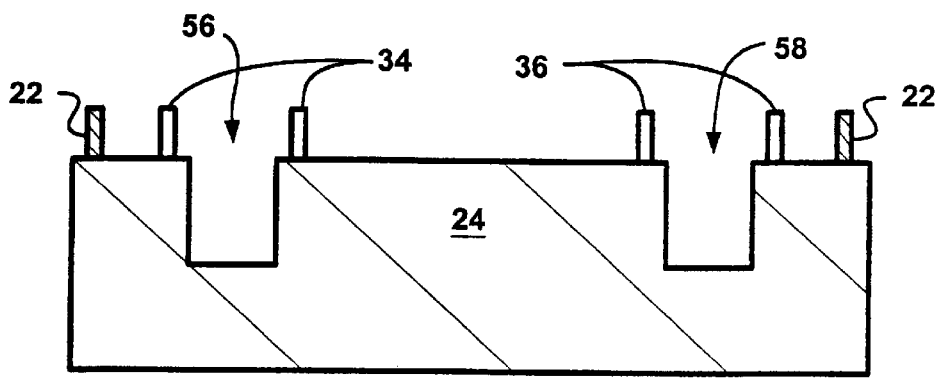

FIG. 2D shows the etched cap wafer 24 with the photoresist layer 54 removed. For illustrative purposes only, the cap wafer 24 has an initial thickness in excess of 200 microns. The cap wafer 24 is then etched to form wells 56 and 58 that, for illustrative purposes, are approximately 100 microns deep. Conventional etching processes, such as a dry etch process, may be used to make the wells 56 and 58. One such dry etch process is a plasma-etch process used to etch high aspect ratio channels and vias in deep silicon etching. The process uses an alternating process of etching and depositing a polymer on the etched walls so that there is minimal undercutting in the dry etch process. This process enables very deep etching with little undercutting. The object is to have a deep enough etch so that the depth of the wells 56 and 58 will exceed the final thickness of the cap wafer 24 after processing. If the final thickness of the cap wafer 24 is under 100 microns, the wells 56 and 58 will be 100 microns or deeper.

Figure 2E:
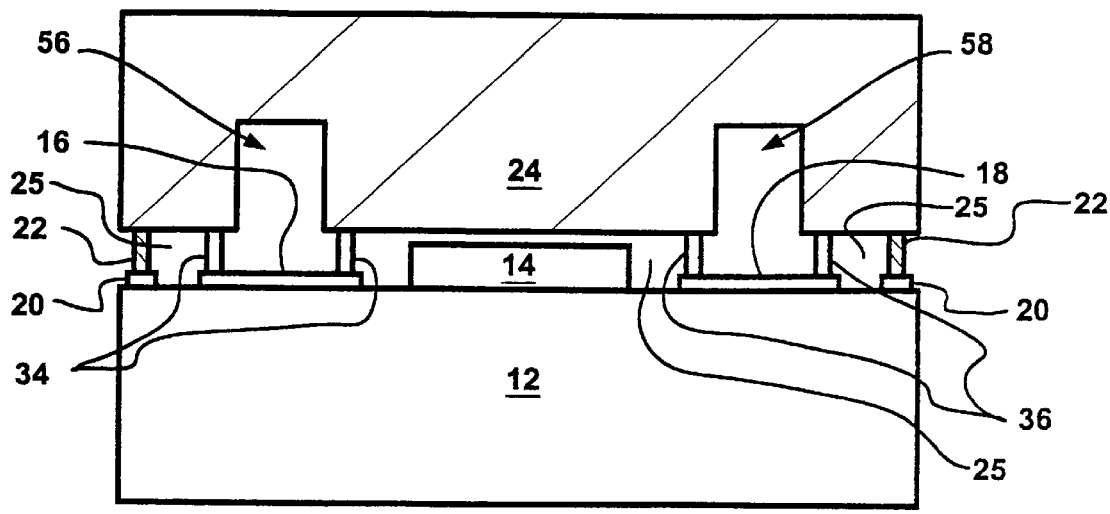

In FIG. 2E, the cap wafer 24 is turned over and aligned to match the base wafer 12. The base wafer 12 has been processed using conventional manufacturing processes to produce the bonding pads 16 and 18 and the peripheral pad 20. Briefly, an adhesion layer (not shown) is deposited on the base wafer 12 and a conductive material is deposited by sputtering or evaporation on the adhesion layer. Patterning is done by photolithography, the unwanted conductive material is etched away, and the photoresist is removed. Another approach is by performing the photolithography, depositing the adhesion layer and the conductive material, and then removing the photoresist and the unwanted conductive material to form the bonding pads 16 and 18 and the peripheral pad 20. Channels or wires (not shown) electrically connect the micro device 14 on the base wafer 12 to the bonding pads 16 and 18. The gaskets 34 and 36, respectively, contact the bonding pads 16 and 18 on the base wafer 12 near the perimeters of the bonding pads 16 and 18, and the gasket 22 contacts the peripheral pad 20. The gaskets 34 and 36 are configured to substantially match the perimeters of the respective bonding pads 16 and 18 such that there is at least enough room inside each of the gaskets 34 and 36 for the bonding wires 30 and 32 to be bonded as shown in FIG. 1.

The base wafer 12 and the cap wafer 24 are then aligned and compressed together at temperatures up to 350 degrees Centigrade until cold weld bonding occurs. The gasket 22 and the peripheral pad 20 fuse together as do the gaskets 34 and 36 with their respective bonding pads 16 and 18. This provides the completely hermetically sealed volume 25 for the micro device 14.

Figure 2F:
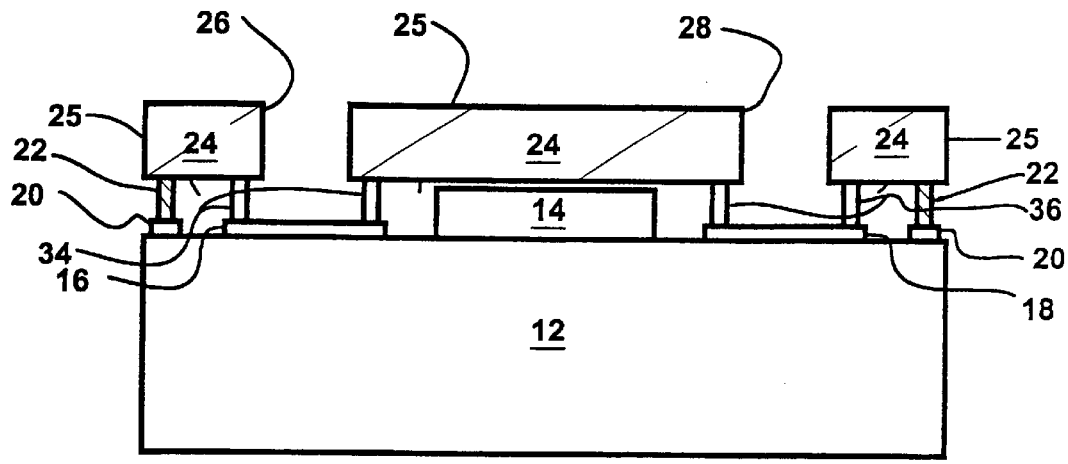

In FIG. 2F, after the hermetic sealing is complete, the cap wafer 24 is thinned into a "microcap" using conventional wafer grinding or lapping and polishing techniques so that the wells 56 and 58 become the through holes 26 and 28. The through holes 26 and 28 extend all the way through the cap wafer 24. The microcap wafer-level package 10 is then ready for connection in a micro device utilizing system (not shown). Electrical contact can be made to the bonding pads 16 and 18 on the base wafer 12 by bonding wires 30 and 32 using conventional bonding techniques, such as ball or wedge bonding. This has the advantage of applying the bonding forces on the relatively thick base wafer 12.

Figure 3A:
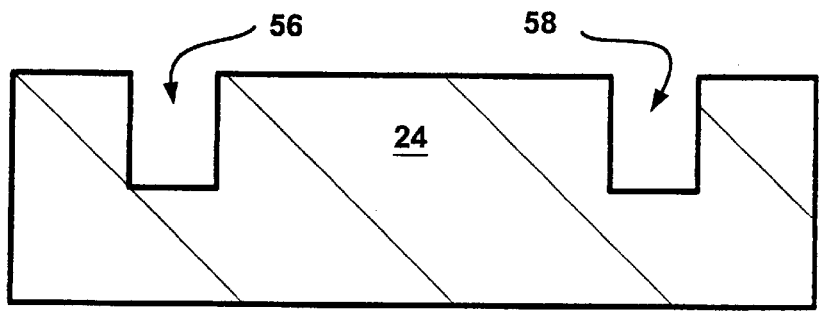
FIGS. 3A through 3C show the process steps for an alternative method of fabricating the microcap wafer-level package of the present invention.
Figure 3B:
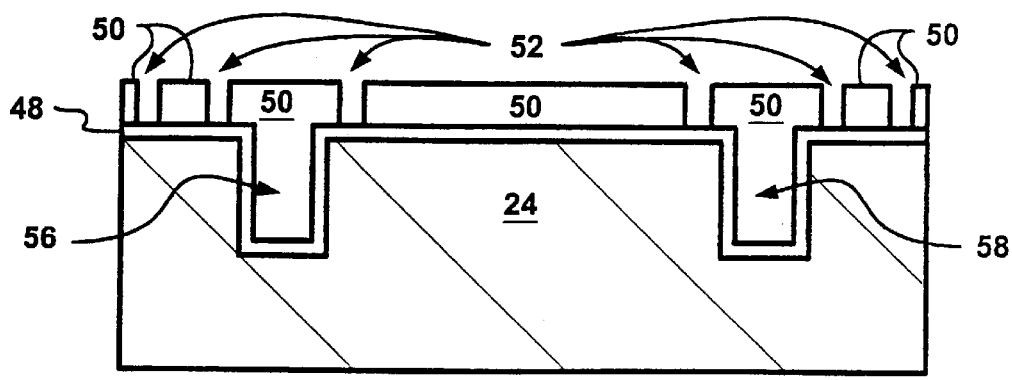
Figure 3C:
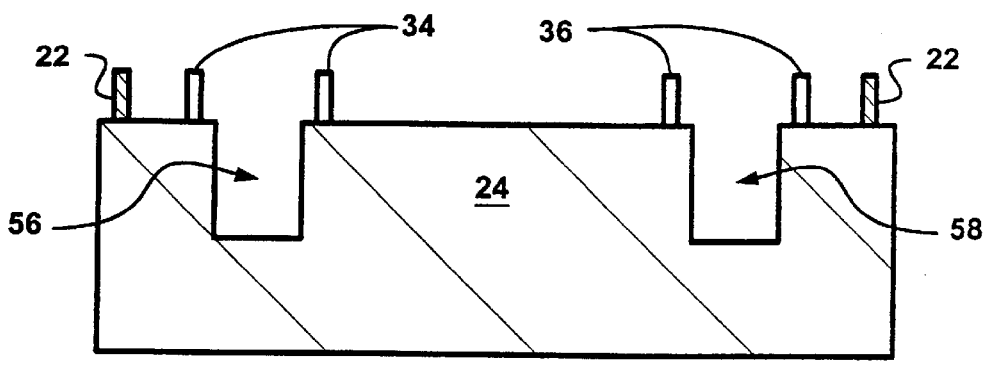

Referring now to FIGS. 3A through 3C, therein are shown various stages of an alternative mode of manufacturing the microcap wafer-level package 10 shown in FIG. 1.

In FIG. 3A, the cap wafer 24 is patterned for wells 56 and 58 using conventional photolithographic techniques. Again, for illustrative purposes only, the cap wafer 24 has an initial thickness in excess of 200 microns. The cap wafer 24 is then etched to form wells 56 and 58 that, for illustrative purposes, are approximately 100 microns deep. Conventional etching processes as previously described may be used to make the wells 56 and 58. Again, the object is to have a deep enough etch so that the depth of wells 56 and 58 will exceed the final thickness of the cap wafer 24 after processing. If the wells 56 and 58 are 100 microns deep, the final thickness of the cap wafer 24 must be under 100 microns so the wells 56 and 58 will form through holes when the final thickness is reached.

In FIG. 3B, the seed layer 48 is deposited through a process such as sputtering over the entire cap wafer 24 and in the wells 56 and 58. Where the seed layer 48 is of gold, it is deposited in a sequence in which an initial deposition of a very thin adhesion layer (not shown) is sputtered. Again, the adhesion layer is of a metal such as chromium, nickel-chromium, titanium or any other metal that adheres well to the cap wafer 24 which is silicon and to the gasket material which is gold. Then gold is deposited on top of the adhesion layer by sputtering. An exemplary thickness of gold would be 2,000 to 3,000 Å. Both layers typically are laid down in a single sputtering run using conventional manufacturing equipment.

Also, a photoresist layer 50 is deposited, exposed and developed in a conventional photolithographic process to produce the pattern openings 52 which define the shapes of the gaskets 22, 34, and 36. It is preferred that thick photoresist lithography be performed to create the pattern for the formation of the gaskets 22, 34, and 36. The photoresist used to pattern the gaskets 22, 34, and 36 needs to be at least as high as the gaskets 22, 34, and 36 are going to be thick. Further, it must fill the wells 56 and 58 in as few layers as possible to avoid the formation of bubbles between the layers of thick photoresist. Multiple layers of thick photoresist may be used so that the photoresist thickness on the surface of the cap wafer 24 is more uniform.

FIG. 3C shows the cap wafer 24 after it has been electroplated using the seed layer 48 as an electrode. The conductive material of the gaskets 22, 34, and 36 is deposited at the openings 52 on the electrically conductive seed layer 48 exposed through the photoresist layer 50. The photoresist layer 50 is then removed using a conventional photoresist stripping technique.

The cap wafer 24 is then ready to be turned over and bonded to the base wafer 12 as shown in FIG. 2E, and the rest of the process is the same.

Figure 4:
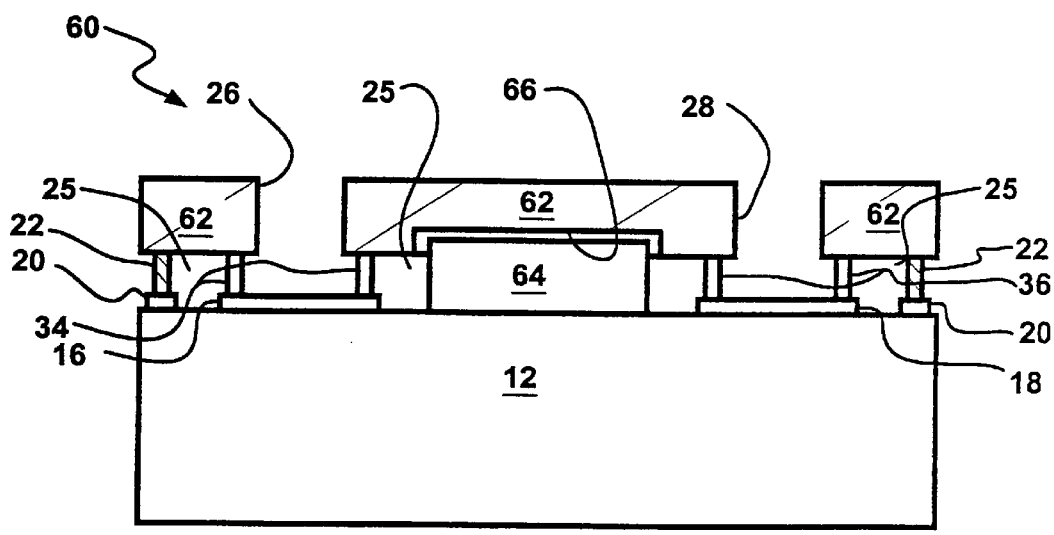
FIG. 4 shows the microcap wafer-level package of the present invention after alternative processing to accommodate a large semiconductor device.

Referring now to FIG. 4, therein is shown a microcap wafer-level package 60 where a wafer 62 has been etched to accommodate a relatively tall, or thick, micro device 64 on the base wafer 12. Accordingly, the gap between the cap wafer 62 and the micro device 64 can be adjusted by adding a step where the recess 66 is defined by a process such as etching in the cap wafer 62 directly above the micro device 64. The additional etching can be performed using a conventional dry etch process to accommodate micro devices that are relatively high or that need to be packaged in as small a package as possible. The thickness of the cap wafer 62 is thereby reduced near the recess 66. This also allows for the use of gaskets 22, 34, and 36 that are shorter than the thickness of the micro device 64 resulting in the use of less material, such as gold, and allowing the use of a more conventional photoresist lithography process.

Figure 5:
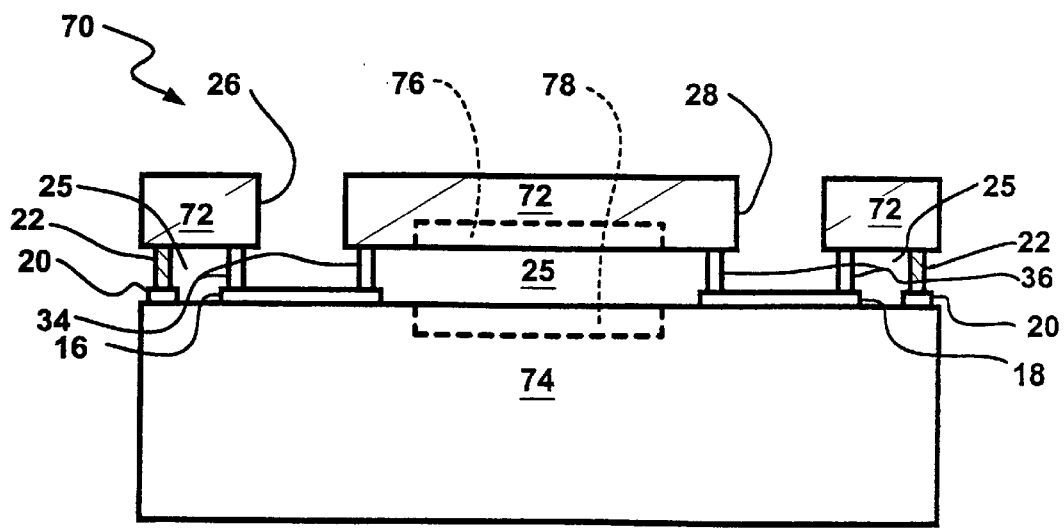
FIG. 5 shows the microcap wafer-level package of the present invention showing alternative positions for an integral integrated circuit.

Referring now to FIG. 5, therein is shown a microcap wafer-level package 70 having a cap wafer 72 and a base wafer 74. Since the wafers are silicon, they can be easily processed using conventional semiconductor manufacturing processes to form the integrated circuits 76 and 78, respectively, in the cap wafer 72 and/or the base wafer 74. Since the gaskets 34 and 36 are made of a conductive material, the integrated circuit 76 is easily electrically connectable through them to the bonding pads 16 and 18 either by retaining portions of the conductive seed layers or by forming polysilicon channels on the cap wafer 72. The integrated circuit 78 in the base wafer 74 is connectable in the same manner as the micro device 14.

Figure 6:
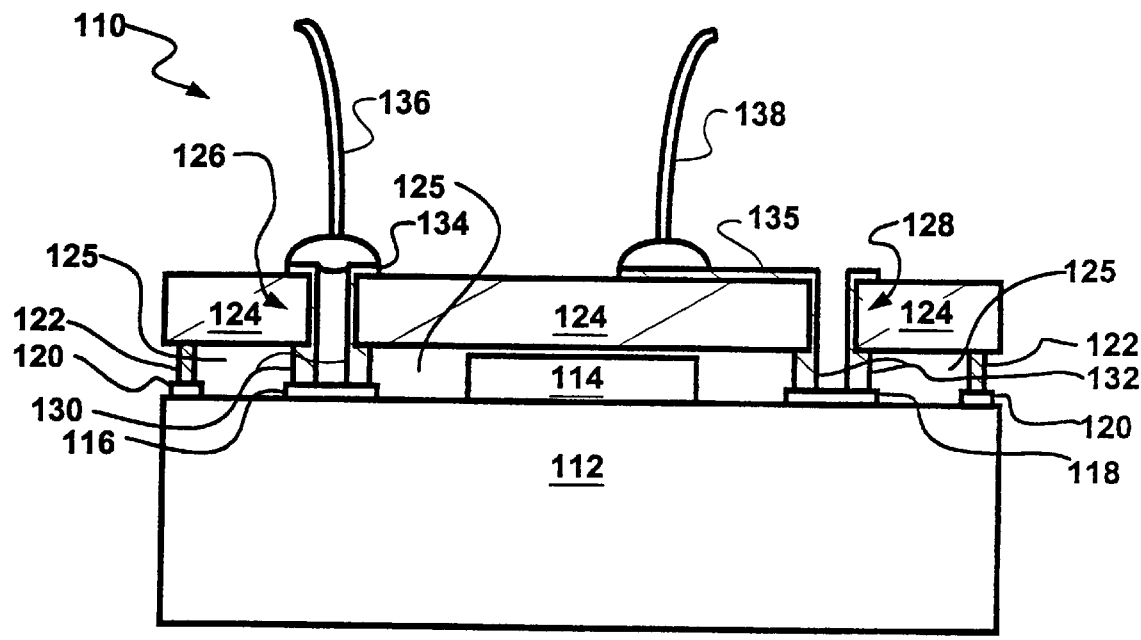
FIG. 6 shows a cross-section of the microcap wafer-level package of an alternate embodiment of the present invention.

It should be noted that a gap is shown between the cap wafer 24 and the micro device 14. The present invention can be used to accommodate devices whether or not such a gap is necessary. For example, for some applications such as some sensors or filters, an air gap above the device is required for the device to work properly. Similarly, if a device comprises a mechanical device and moving parts that need to be free moving as in an accelerometer or pressure sensor, then a gap may be required. In the case of integrated circuit devices, for example, the gap may not be required. The distance of the gap can be controlled by a combination of how high the gaskets are plated and how much pressure is applied to combine the cap wafer 24 with the base wafer 12 by compressing the gaskets thereby avoiding the need for multi-layered gaskets. Approaches similar to those shown in FIGS. 4 and 5 could also be applied. Referring now to FIG. 6, therein is shown a cross section of a microcap wafer-level package 110 having a base wafer 112. The base wafer 112 has an associated micro device 114, such as an active device like an integrated circuit or a passive device like a sensor. The micro device 114 is electrically connected to bonding pads 116 and 118 by conductive leads not shown) also associated with the base wafer 112. Around the perimeter of the base wafer 112 is a peripheral pad 120 which may be deposited at the same time as the bonding pads 116 and 118, and may be of the same thickness.

A peripheral pad seal, or gasket 122, extends between a cap wafer 124 and the peripheral pad 120 on the base wafer 112 and is cold weld bonded to the peripheral pad 120 to provide a hermetically-sealed volume 125 around the micro device 114. The cap wafer 124 can be made of an electronically non-conductive material or a high-resistivity semiconductor material, such as single crystal silicon. Preferably, however, both the base wafer 112 and the cap wafer 124 are made of the same material to avoid thermal expansion mismatch problems.

The cap wafer 124 has conductive vias 126 and 128 provided therein. Contact gaskets 130 and 132 are respectively formed on the conductive vias 126 and 128 at the same time the gasket 122 is formed. The contact gaskets 130 and 132 are cold weld bonded to the respective bonding pads 1 16 and 118 to make the electrical connections to the micro device 114. With the present invention, electrical connections (not shown) between the micro device 114 and its bonding pads, such as the bonding pads 116 and 118, are located in the hermetically-sealed volume 125 and do not pass through the gasket 122.

The cap wafer 124 is further provided with outside bonding pads 134 and 135 having conductors, or bonding wires 136 and 138, respectively, bonded thereto for connecting the microcap wafer-level package 110 and the micro device 114 to a micro device-utilizing system (not shown). The outside bonding pad 135 may be offset from the centerline of the conductive via 128 which is open since the contact gasket 132 provides a hermetic seal.

The bonding pads 116 and .118, the peripheral pad 120, and the contact gaskets 130 and 132, in the embodiment shown are of gold; however, other materials can be used without departing from the scope of the present invention. For example, other materials capable of being bonded to each other can be used, such as silicon, indium, aluminum, copper, silver, alloys thereof, and compounds thereof.

Figure 7A:
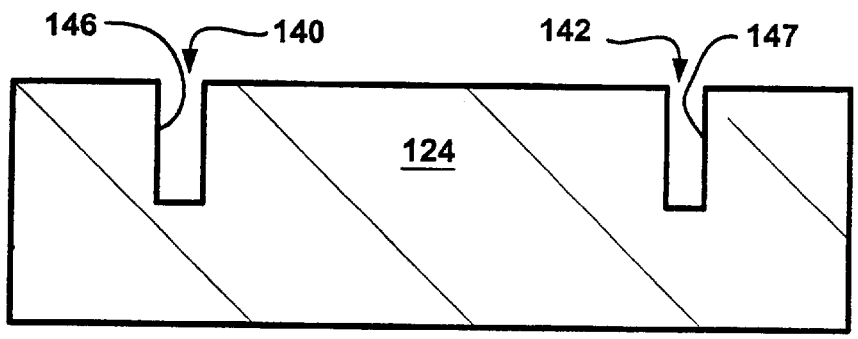
FIGS. 7A through 7E show the process for fabricating the microcap wafer-level package of the alternate embodiment of FIG. 6.

Referring now to FIGS. 7A through 7E, therein are shown the process steps for fabricating the microcap wafer-level package 110 shown in FIG. 6. Hereinafter, all components, which are the same in the various figures, will use the same description and number notations. FIG. 7A shows the cap wafer 124 with wells 140 and 142 formed having respective walls 146 and 147. The wells 140 and 142 are formed using conventional photolithographic and etching processes. One conventional etching processes is dry etching, which is a plasma-etch process used to etch high-aspect ratio channels and vias in deep silicon etching. The process uses an alternating process of etching and depositing a polymer on the etched walls so that there is minimal undercutting. This process enables very deep etching with little undercutting. The object is to have a deep enough etch so that the depth of wells 140 and 142 will exceed the final thickness of the cap wafer 124 after processing. The processing involves reducing the thickness of the cap wafer 124 on the non-well side by a process such as grinding or lapping and polishing to expose the wells 140 and 142. For illustrative purposes only, the cap wafer 124 has an initial thickness in excess of 200 microns. The cap wafer 124 is then etched to form wells 140 and 142 that, for illustrative purposes, are approximately 1 to 50 microns in diameter and over 100 microns deep.

Figure 7B:
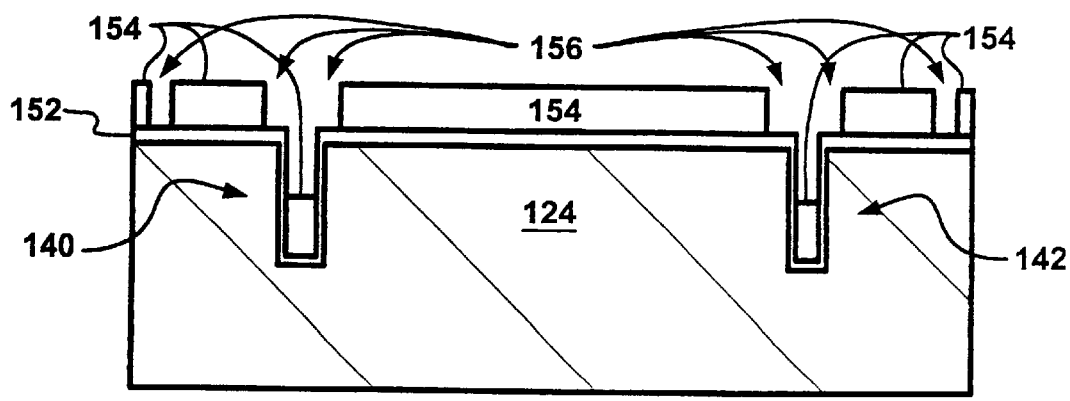

In FIG. 7B, a conductive seed layer 152 is deposited through a bias sputtering or evaporation process over the entire well-side surface of the cap wafer 124. In the best mode, the seed layer 152 is of gold and is deposited in a sequence starting with a very thin adhesion layer (not shown) being bias sputtered. The adhesion layer is of a material that adheres well to the cap wafer 124 and to which the seed layer 152 also adheres well. Metals such as chromium, nickel-chromium, titanium, or an alloy thereof are used when the seed layer 152 is gold and the cap wafer 124 is silicon. The adhesion layer is used because the gold itself does not adhere well directly to silicon. Then gold is deposited on top of the adhesion layer by sputtering to a 4,000 to 5,000 A thickness in the present example. Both layers, however, typically are laid down in a single sputtering or evaporation run using conventional manufacturing equipment. To further encourage gold coverage of the walls 146 and 147, the first layer of gold may be sputter etched off throwing some of the gold material at the bottom of the wells 140 and 142 onto the walls 146 and 147. This would be followed by a final bias sputtering of gold.

A photoresist layer 154 is deposited, exposed and developed in a conventional photolithographic process to form the pattern openings 156 which define the shapes of the contact gaskets 130 and 132 and the gasket 122. It is preferred that thick photoresist lithography be used to create the pattern for the formation of the contact gaskets 130 and 132 and the gasket 122. Standard photoresist forms relatively thin layers so a higher viscosity, thick photoresist layer 154 is required. The thick photoresist layer 154 used to pattern the contact gaskets 130 and 132 and the gasket 122 needs to be at least as thick as the final thickness the contact gaskets 130 and 132 and the gasket 122. The photoresist layer 154 can be deposited in multiple layers so that the photoresist thickness on the surface of the cap wafer 124 is more uniform.

Figure 7C:
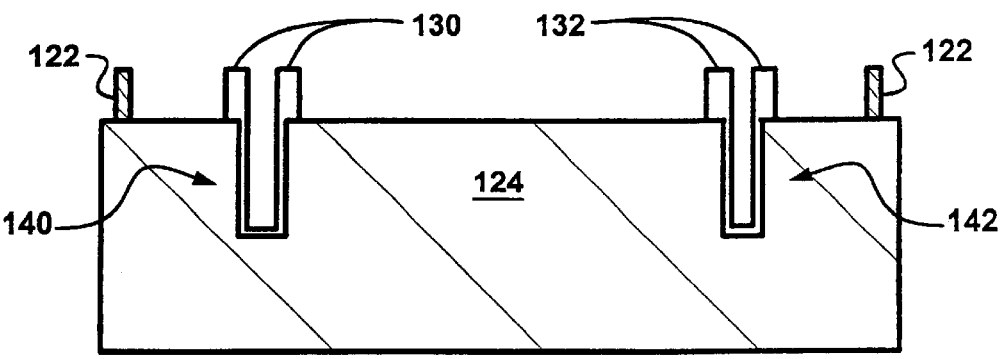

FIG. 7C shows the cap wafer 124 after it has been electroplated using the seed layer 152 as an electrode. The conductive material of the contact gaskets 130 and 132 and the gasket 122 is deposited in the pattern openings 156 in the photoresist layer 154 on the seed layer 152. The photoresist layer 154 is removed by using a conventional photoresist stripping technique. The remaining seed layer 152 is selectively etched away by a conventional etching process. As the seed layer 152 is removed, the contact gaskets 130 and 132 and the gasket 122 are reduced in height and thinned by the thickness of the seed layer 152 that is removed.

Figure 7D:
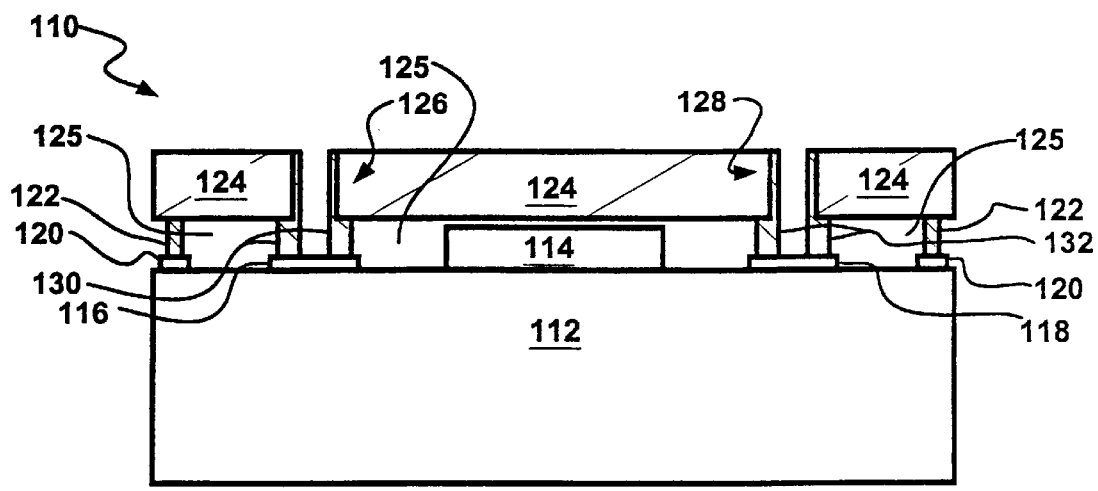

In FIG. 7D the cap wafer 124 is turned over and aligned to match the base wafer 112. The base wafer 112 is processed using conventional photolithographic processes to produce the bonding pads 116 and 118 and the peripheral pad 120. Briefly, an adhesion layer (not shown) is deposited on the base wafer 112 and a conductive material is deposited by sputtering or evaporation. Patterning is done by photolithography, the unwanted conductive material is etched away, and the photoresist is removed. Another approach is by performing the photolithography, depositing the adhesion layer and the conductive material, and then removing the photoresist and the unwanted conductive material to form the contact gaskets 130 and 132, and the gasket 122. The base wafer 112 also has the micro device 114 associated with it, which is electrically connected to the bonding pads 116 and 118 by channels or wires (not shown).

The base wafer 112 and the cap wafer 124 are then aligned. The contact gaskets 130 and 132 contact the bonding pads 116 and 118, respectively, on the base wafer 1 12 while the gasket 122 contacts the peripheral pad 120.

The base wafer 112 and the cap wafer 124 are then compressed together at temperatures up to 350 degrees Centigrade until cold weld bonding occurs. The contact gaskets 130 and 132 weld with their respective bonding pads 116 and 118. At the same time, the gasket 122 and the peripheral pad 120 weld together. This provides the completely hermetically sealed volume 125 for the micro device 114.

After the hermetic sealing has been completed, the cap wafer 124 is thinned to form a "microcap" using a wafer grinding or lapping and polishing techniques until the wells 140 and 142 are opened up and the conductive vias 126 and 128 extend all the way through the cap wafer 124.

Figure 7E:
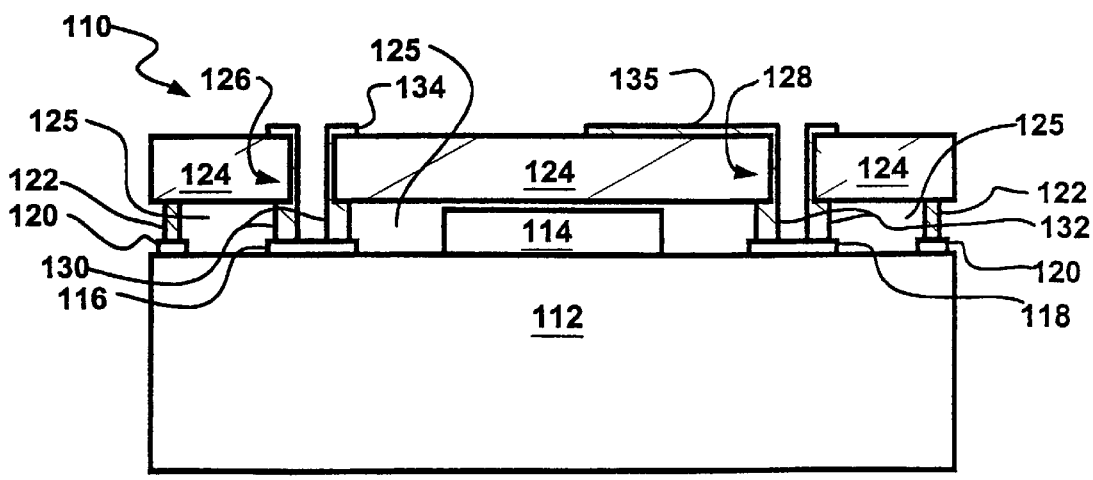

In FIG. 7E, a metal layer, such as nickel-chromium and gold, is bias sputtered over the cap wafer 124 to 7000 Å thickness in the present example. A standard photolithographic and etching process is then used to form outside bonding pads 134 and 135. The outside bonding pad is directly over the conductive via 126 and the outside bonding pad 135 is offset from the conductive via 128.

The microcap wafer-level package 110 is then ready for connection in a micro device utilizing system (not shown). Electrical contact can be made to the outside bonding pads 134 and 135 that are outside the hermetically sealed volume 125 on the cap wafer 124. The bonding wires 136 and 138, shown in FIG. 6, can be bonded to the respective outside bonding pads 134 and 135 using conventional bonding techniques, such as ball or wedge bonding. In a further alternate mode, it is possible to extend the bonding pad, as shown by bonding pad 135, so as to bond in a location offset from the conductive via 128 and thus place the wires 136 and 138 close together for a more compact wafer-level package 110.

It should be noted that a gap is shown between the cap wafer and the micro device. The present invention can be used to accommodate devices whether or not such a gap is necessary. For example, for some applications such as some sensors or filters, an air gap above the device is required for the device to work properly. Similarly, if a device comprises a mechanical device and moving parts that need to be free moving as in an accelerometer or pressure sensor, then a gap may be required. In the case of integrated circuit devices, for example, the gap may not be required. The distance of the gap can be controlled by a combination of how high the gaskets are plated and how much pressure is applied to combine the cap wafer with the base wafer by compressing the gaskets thereby avoiding the need for multi-layered gaskets.

The present invention has applicability in any situation requiring wafer-level packaging. The present invention can be used to package both active and passive devices, including but not limited to integrated circuits, filters, pressure sensors, accelerometers, different types of mechanical calorimeters, and other devices.

Although the present invention has been shown and described with respect to each microcap wafer-level package, it will be apparent to those skilled in the art that the methods described allow for wafer-level manufacturing of a plurality of microcap wafer-level packages at a time. The processes described can be implemented to all the micro devices on a given wafer. The individual packaged devices can then be cut, or diced, in a conventional manner to provide individual devices that are hermetically packaged.

Additionally, while the present invention has been described in conjunction with specific embodiments of the best mode, it is to be understood that many alternatives, modifications, and variations will be apparent to those skilled in the art in light of the foregoing description. Accordingly, it is intended to embrace all such alternatives, modifications, and variations, which fall within the scope of the present invention as, set forth in the appended claims. All matters set forth herein or shown in the accompanying drawings are to be interpreted in an illustrative and non-limiting sense.

The invention claimed is:

1. A wafer package comprising:

a base wafer having a bonding pad and a peripheral pad formed thereon, said peripheral pad encompassing said bonding pad;

a cap wafer having a bonding pad seal and a peripheral pad seal formed thereon, said bonding pad seal bonding around the perimeter of said bonding pad and said peripheral pad seal bonding with said peripheral pad to define a hermetically sealed volume between said cap wafer and said base wafer, said cap wafer defining a through hole therein positioned over said bonding pad, said through hole providing access to said bonding pad; and a micro device associated with at least one of said wafers, said micro device being disposed inside said peripheral pad seal and outside said bonding pad seal in said hermetically sealed volume, said micro device in conductive contact with said bonding pad.

2. The wafer package as claimed in claim 1 including:

a seed layer in said through hole conductively connected to said bonding pad by said bonding pad seal.

3. The wafer package as claimed in claim 2 including:

an outside bonding pad connected to said seed layer in said through hole conductively connected to said bonding pad by said seed layer.

4. The wafer package as claimed in claim 3 wherein:

said outside bonding pad is offset from said through hole.

5. The wafer package as claimed in claim 4 including:

a micro device utilizing device connected to said outside bonding whereby said micro device utilizing device is connected to said micro device.

6. The wafer package as claimed in claim 1 wherein:

said cap wafer defines a recess located above said micro device whereby a tall micro device is accommodated.

7. The wafer package as claimed in claim 1 including:

a micro device utilizing system; and a connection between said micro device utilizing system and said bonding pad on said base wafer through said through hole in said cap wafer.

8. The wafer package as claimed in claim 1 wherein:

said cap wafer and said base wafer are of the same material; and said bonding pad seal and said peripheral seal include a material selected from a group consisting of gold, silicon, indium, aluminum, copper, silver, an alloy thereof, and a compound thereof.

9. The wafer package as claimed in claim 1 wherein:

said micro device is selected from a group consisting of an active device, a passive device, and a combination thereof.

10. The wafer package as claimed in claim 1 wherein:

said micro device is an integrated circuit in one of said wafers.

* * * * *